ELECTRONIC COMPONENTS JOINED BY TIN-SILVER EUTECTIC SOLDER

Filed Feb. 16, 1967

INVENTOR.
DAVID A. LUPFER
BY
Hopgood & Calimafde
ATTORNEYS

United States Patent Office 3,503,721
Patented Mar. 31, 1970

3,503,721

ELECTRONIC COMPONENTS JOINED BY TIN-SILVER EUTECTIC SOLDER

David A. Lupfer, Metuchen, N.J., assignor to Nytronics, Inc., Berkeley Heights, N.J., a corporation of New Jersey Filed Feb. 16, 1967, Ser. No. 616,649
Int. Cl. B32b *15/04*
U.S. Cl. 29—195 4 Claims

ABSTRACT OF THE DISCLOSURE

An article of manufacture is provided in the form of an electronic impedance component comprising a ceramic dielectric member, an electrically conductive thin metal film electrically associated with a surface of the ceramic dielectric member, and a lead connector joined by means of a solder to said electrically conductive thin metal film, the solder consisting essentially of a eutectic composition of tin and silver.

This invention relates to a method of soldering electronic components and to a special tin-silver solder which is tarnish and corrosion resistant and has good wetting properties.

Soldering plays an essential part in the manufacture of electronic components. The efficient assembling of elements into electronic components requires that the solder material be meltable by such devices as a soldering iron, have good wetting properties with the usual metals of construction employed in the production of electronic components, be capable of flowing into the interstices between adjacent parts and form the desired fillet or fillets, exhibit adequate ductility required for shock absorption purposes, and be economical in application.

While it is quite common to join wires together or to join wires to a terminal board, a special aspect of the invention is that of fastening or joining lead connectors, such as tinned copper leads, to a silvered ceramic. The silvered ceramic may be a special substrate or mounting plate, but particularly it may be an element of an electronic capacitor, such as a miniaturized capacitor. Where soldering to a thin silver film is made, certain requirements must be met. Generally speaking, the silver film is usually a fired-on type, which means that the silver has a small mass effect and is bonded with a glassy material (for example, a thickness of 0.001 inch). Most solders employed, for example lead-tin solder, have a tendency to dissolve a portion of the metallized surface which adversely affects the resulting electronic component. Generally, the lead-tin alloy is a eutectic which melts at 183° C. This solder is undesirable in many applications. For example, it may be necessary to solder the leads of the finished internally soldered soldered component in a rapid dip soldering bath in instances where bath temperatures above 183° C. are employed to effect the joining rapidly and efficiently. Where the lead connectors to be soldered to a printed circuit board are short and where the electronic component is a soldered miniaturized capacitor, resistor or other component, heat conducted via the lead connectors to the component tends to melt the solder in the internal joint and render the electronic component inoperable. Using a solder for the electronic component having a melting point higher than the dip soldering bath in many instances had its limitations. For example, tin which melts at 232° C. is unsatisfactory because it dissolves silver rapidly. Copper-silver solders are hard and lack the required ductility.

I have now found a special solder comprising a eutectic composition of tin-silver which overcomes the difficulty inherent in other solders.

It is thus an object of my invention to provide a tin-silver solder for use in soldering together electronic components.

Another object is to provide as an article of manufacture an electrical component comprising a lead connector joined to an electrically conductive element by means of a solder consisting essentially of a eutectic composition of tin and silver.

A further object is to provide as an article of manufacture an electrical impedance component comprising a lead connector joined by means of a eutectic composition of a tin-silver alloy to an electrically conductive element associated with a non-metallic element, for example a miniaturized capacitor.

These and other objects will more clearly appear from the following description and the accompanying drawing, wherein.

In carrying my invention into practice, I find I get improved soldering results by employing a eutectic composition of tin-silver, said composition being essentially 96½% by weight of tin and 3½% by weight of silver. The eutectic melts at 221° C. and is characterized in view of its composition by the fact that it is particularly suited for joining a lead connector to a silvered ceramic surface without adversely dissolving off the silver from the surface. This is particularly important because the silver layer is very thin. The solder is ductile in the solid state and is tarnish and corrosion resistant. The eutectic is preferred because it has a sharp melting and freezing point and, therefore, is particularly applicable for dip soldering purposes. However, the composition can vary over operable limits as is well known in the field of soldering, and still provide the desired results. Thus, the silver content can vary from about 2% to 10%, and more preferably, from about 3 to 4%. In stating that the preferred alloy is essentially a eutectic composition is meant to include the variation mentioned above.

Figure 1:
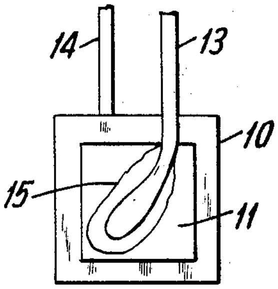
FIGS. 1 to 3 are illustrative of minaturized ceramic capacitors in which the lead connectors are soldered to the metal facings of the capacitors.
Figure 2:
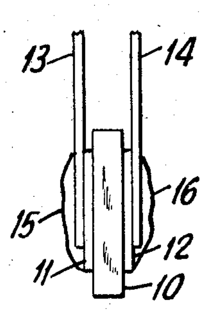
Figure 3:
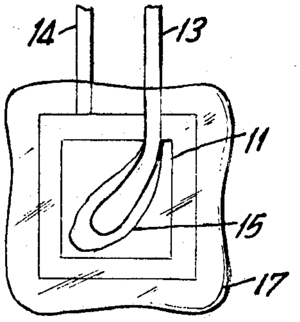
Figure 4:
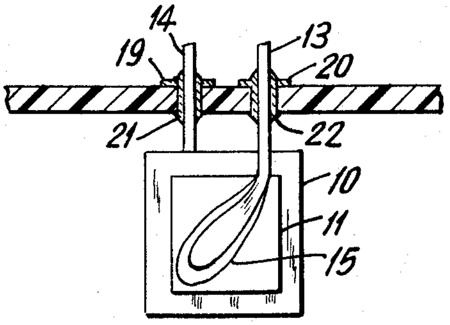
FIG. 4 is a fragment of a printed circuit assembly showing the soldered connection of a capacitor to a printed circuit element as obtained by dip soldering or other soldering methods.

As illustrative of the use of the alloy in producing electronic components, reference is made to FIGS. 1 to 3 which show a miniaturized capacitor comprising a thin ceramic substrate or wafer 10 of a suitable non-metallic dielectric material upon which the metallic film layers 11 and 12 of suitable electrically conductive material, e.g. silver, platinum, copper, is deposited to form capacitor plates. The dielectric material may be rectangular, circular, cylindrical or any convenient shape. As a miniaturized capacitor, the wafer may be 0.005″ thick and a square about ¼″ on the side. The deposited metal film forming the plates may be about 0.001″ thick. The film may be applied by any suitable process such as, for example, by evaporation, sputtering, pyrolitic deposition, displacement from solution, spraying, or painting. After the adherent metallic film has been obtained, lead connectors 13 and 14, of, for example, tinned copper, or other suitable electrically conductive material, are soldered to the metal films 11 and 12 to form solder joints 15 and 16. Each of the leads may be flattened at the end as shown in order to obtain a joint of the desired strength. The joint is made by bringing the end of the lead in contact with the metal film of silver or other metal in the presence of the molten solder. This can be done by dip soldering, that is by dipping the assembled parts in a molten bath of the solder, or by means of a soldering iron.

Where it is desired to protect the capacitor against moisture or corrosive agents prevailing in a particular environment, the part is dipped in a plastic bath to hermetically seal the elements of the capacitor in a coating 17 shown in FIG. 4. The advantages of the solder are that coating temperatures up to below 221° C. can be employed without melting the eutectic alloy bond of the capacitor.

Referring to FIG. 4, the capacitor of FIGS. 1 to 3 is shown mounted on a portion of a printed circuit panel of a printed circuit assembly. The leads of the capacitor are soldered to metal plate 11 using the tin-silver eutectic composition. In mounting the capacitor on the panel, it may be done by dip soldering. As shown in FIG. 4, the lead connectors 13 and 14 of, for example, tinned copper, are brought through openings in a panel 18 of hard plastic, or other non-conductive mounting surface, the openings having printed circuit elements 19 and 20 in proximity therewith. The assembly is then dipped in a bath of molten solder held at a temperature below the 221° C., for example at 215° C. A solder dip may comprise a eutectic alloy of lead-tin containing 39.1% lead and 60.9% tin. This alloy has a melting point of 183° C. which is 38° C. below the melting point of the tin-silver eutectic. In FIG. 4, the lead-tin solder is showing filling the openings at 21 and 22 of the panel while at the same time it solders printed circuit elements 19 and 20 to their respective leads.

Broadly, in soldering an electronic component and mounting it to a printed circuit, the method comprises, forming an electronic component by contacting a lead connector with an electrically conductive element in the presence of a first molten solder consisting essentially of a eutectic composition of a tin-silver alloy, forming a jointed structure by cooling said solder to solidify it, associating the electronic component with a printed circuit assembly by bringing a portion of said lead connector in soldering proximity to a printed circuit element cooperably associated with the assembly while applying a second molten solder held at a liquidus temperature below the melting point of the tin-silver solder of the electronic component, and cooling the second solder to solidify it.

Figure 5:
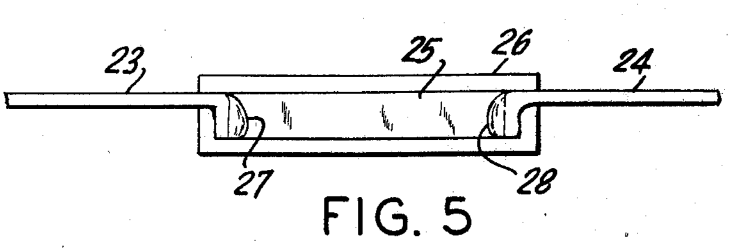
FIG. 5 depicts a thin film resistor showing lead connectors soldered to the ends of the film supported on a ceramic wafer.

In FIG. 5, I show another electrical component comprising a thin film resistor in which a pair of lead connectors 23 and 24 are soldered to the ends of a thin metal film 25 deposited on a ceramic support 26. The eutectic solder composition is shown at 27 and 28 of the resistive element. As stated above, the leads may be tinned copper or other electrically conductive metal and the thin film 25 may be silver, copper, platinum and the like.

Although the present invention has been described in conjunction with preferred embodiments, it is to be understood that modifications and variations may be resorted to without departing from the spirit and scope of the invention as those skilled in the art will readily understand. Such modifications and variations are considered to be within the purview and scope of the invention and the appended claims.

What is claimed is:

1. As an article of manufacture, an electronic impedance component comprising a ceramic dielectric member, an electrically conductive thin metal film selected from the group consisting of silver, platinum and copper electrically associated with a surface of said ceramic dielectric member and a lead connector joined by means of a solder to said electrically conductive thin metal film, said solder consisting essentially of a eutectic composition of tin and silver.

2. The electronic impedance component of claim 1, wherein the eutectic tin-silver solder consists essentially of about 3 to 4% silver.

3. The impedance component of claim 2, wherein the electrically conductive thin metal film to which the lead connector is soldered is silver.

4. The impedance component of claim 3 wherein the lead connector is tinned copper.

References Cited

UNITED STATES PATENTS

| | | | |
|---|---|---|---|
| 1,565,115 | 12/1925 | Speed et al. | 75—175 |
| 1,626,038 | 4/1927 | Ireland | 75—175 |
| 2,530,413 | 11/1950 | Warth | 75—175 |
| 3,002,137 | 9/1961 | Kahn et al. | 317—261 |
| 3,157,473 | 11/1964 | Acton | 29—195 X |
| 3,157,733 | 11/1964 | De Masi | 317—101 X |
| 3,189,420 | 6/1965 | Gould | 29—195 |

OTHER REFERENCES

Max Hansen: "Constitution of Binary Alloys," 2nd ed., New York, McGraw-Hill, 1958, pp. 52 and 53 relied on.

L. DEWAYNE RUTLEDGE, Primary Examiner

E. L. WEISE, Assistant Examiner

U.S. Cl. X.R.

75—175